United States Patent
Yoshino et al.

(10) Patent No.: US 8,426,285 B2
(45) Date of Patent: Apr. 23, 2013

(54) METHOD OF FABRICATING SEMICONDUCTOR DEVICE

(75) Inventors: Kenichi Yoshino, Oita-ken (JP); Kiyotaka Miyano, Tokyo (JP); Tomonori Aoyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/894,424

(22) Filed: Sep. 30, 2010

(65) Prior Publication Data

US 2011/0076842 A1 Mar. 31, 2011

(30) Foreign Application Priority Data

Sep. 30, 2009 (JP) .................... 2009-228924

(51) Int. Cl.
*H01L 21/336* (2006.01)
(52) U.S. Cl.
USPC ........... 438/308; 438/378; 438/473; 438/487; 257/E21.328
(58) Field of Classification Search .......... 438/308, 438/378, 473, 487, 795
See application file for complete search history.

(56) References Cited

U.S. PATENT DOCUMENTS

| | | | | |
|---|---|---|---|---|
| 7,759,259 | B2 * | 7/2010 | Ito .................................. | 438/763 |
| 7,842,583 | B2 * | 11/2010 | Tsukamoto et al. .......... | 438/458 |
| 2003/0157813 | A1 * | 8/2003 | Downey et al. ............... | 438/795 |
| 2007/0020892 | A1 * | 1/2007 | Kim .............................. | 438/479 |
| 2007/0215918 | A1 * | 9/2007 | Ito et al. ........................ | 257/288 |
| 2008/0214020 | A1 * | 9/2008 | Ito et al. ........................ | 438/795 |
| 2010/0120263 | A1 * | 5/2010 | Hsueh et al. .................. | 438/795 |

FOREIGN PATENT DOCUMENTS

| | | |
|---|---|---|
| JP | 6-201771 | 7/1994 |
| JP | 2002-141504 | 5/2002 |
| JP | 2005-524998 | 8/2005 |
| JP | 2008-192924 | 8/2008 |

OTHER PUBLICATIONS

English-language translation of Notice of Reasons for Refusal issued by the Japanese Patent Office on Feb. 1, 2013, for Japanese Patent Application No. 2009-228924.

* cited by examiner

*Primary Examiner* — Hsien Ming Lee
(74) *Attorney, Agent, or Firm* — Finnegan, Henderson, Farabow, Garrett & Dunner, L.L.P.

(57) ABSTRACT

An ion implantation is performed to implant ions into a silicon substrate, and a microwave irradiation is performed to irradiate the silicon substrate with microwaves after the ion implantation. After the microwave irradiation, the silicon substrate is transferred to a heat-treatment apparatus, where the silicon substrate is treated with heat by being irradiated with light having a pulse width ranging from 0.1 milliseconds to 100 milliseconds, both inclusive.

11 Claims, 12 Drawing Sheets

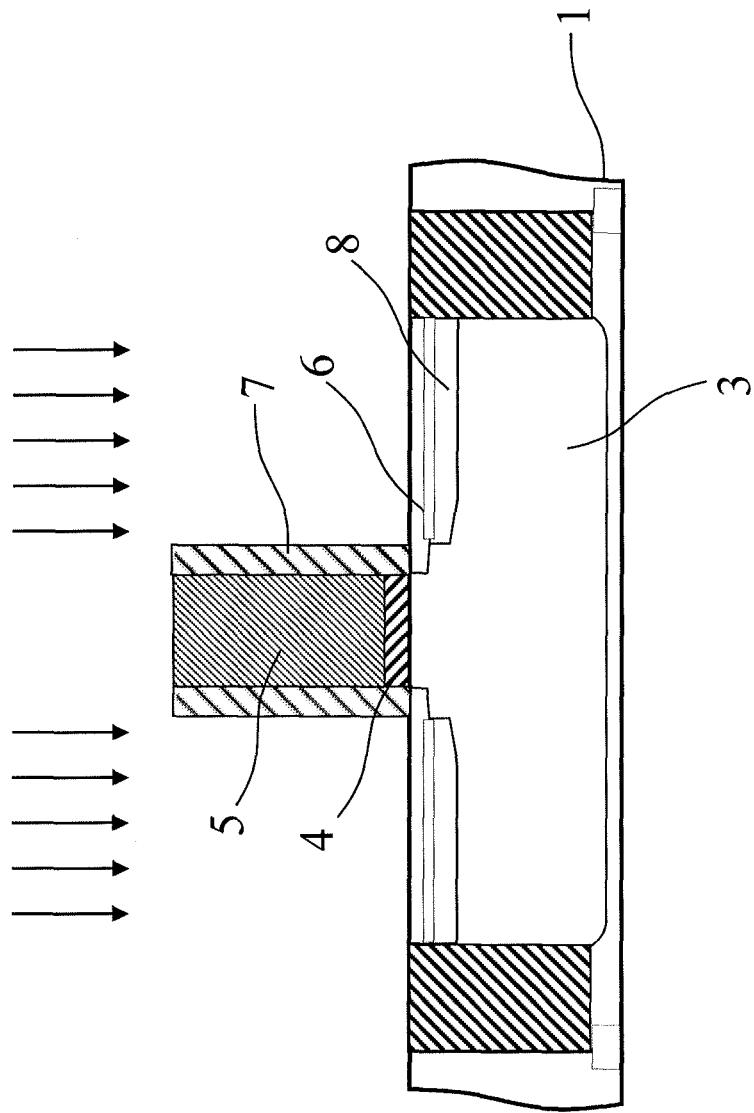

METHOD OF FABRICATING SEMICONDUCTOR DEVICE

CROSS-REFERENCE TO RELATED APPLICATIONS

This Application is based upon and claims the benefit of priority from the prior Japanese Patent Application No. P2009-228924, filed on Sep. 30, 2009; the entire contents of which are incorporated herein by reference.

BACKGROUND

1. Field

Embodiments described herein relate generally to methods of fabricating a semiconductor device.

2. Description of Related Art

Rapid thermal annealing (RTA) using a halogen lamp is a conventionally employed annealing method. Forming a shallow impurity diffused layer is difficult by using RTA, however. This is because impurity ions (e.g., boron (B) ions, phosphorus (P) ions, arsenic (As) ions, or the like) implanted into a semiconductor substrate diffuse in RTA because these ions have large diffusion coefficients in the semiconductor substrate (e.g., silicon (Si) substrate). It is possible to carry out the annealing at a lower temperature in order to restrain the diffusion of the impurity ions. The lowering of the annealing temperature, however, involves a problem of making the impurities less active, and thus increasing the electrical resistance of the impurity diffused layer. For this reason, with the conventional RTA processing using a halogen lamp, it is difficult to form a low-resistant, shallow impurity diffused layer (having a depth of 20 nm or less).

Under the circumstances, techniques that enable the formation of a low-resistance, shallow impurity diffused layer have been studied in recent years. One of the studied techniques is an annealing method using a flash lamp filled with a noble gas, such as xenon (Xe) (hereafter, the method will be referred to as the flash lamp annealing). Another one of the studied techniques is an annealing method using a $CO_2$ laser or the like (hereafter, the method will be referred to as the laser annealing). Both the flash lamp annealing and the laser annealing are ultra-short time annealing methods on a millisecond order (hereafter, referred to as the millisecond annealing (MSA)). Since being the ultra-short time and high-temperature annealing methods, the flash lamp annealing and the laser annealing achieve both the restraining of the diffusion of impurity ions and a higher activation of the impurity ions, and thereby enable the formation of a low-resistance, shallow impurity diffused layer (see, for example, Patent Document 1). In MSA, a semiconductor substrate has to be preliminarily heated before the annealing since the semiconductor substrate is annealed to a high temperature within a short period of time. Specifically, a preliminarily-heating process with a halogen lamp precedes the flash lamp annealing (see, for example, Patent Document 1). In this way, the MSA makes it possible to form a low-resistance, shallow impurity diffused layer. However, due to the annealing of such an ultra-short period of time, the MSA possibly fails to sufficiently fix up the crystal defects formed in the semiconductor substrate at the ion implantation. The crystal defects that are not fixed up sufficiently may cause electric current to flow through the crystal defects, i.e., the junction leakage. The junction leakage may cause various problems, such as an increase in the electric power consumption and failure of the ON/OFF action of the transistor.

To address these problems, Patent Document 2 discloses a method using the flash lamp annealing and Spike RTA (spike rapid thermal annealing) in combination. The flash lamp annealing can activate the impurity ions whereas the Spike RTA can fix up the crystal defects formed in the semiconductor substrate. Fixing up the crystal defects by the Spike RTA, however, requires heating the semiconductor substrate to a relatively high temperature (e.g., 1000° C. or higher). Such a high temperature diffuses the impurity ions implanted in the semiconductor substrate, thereby making it difficult to form a shallow impurity diffused layer.

BRIEF DESCRIPTION OF THE DRAWINGS

FIG. 1C is a schematic sectional view illustrating a stage of the method of fabricating a semiconductor device according to the first embodiment of the invention.

DETAILED DESCRIPTION

Figure 1A:
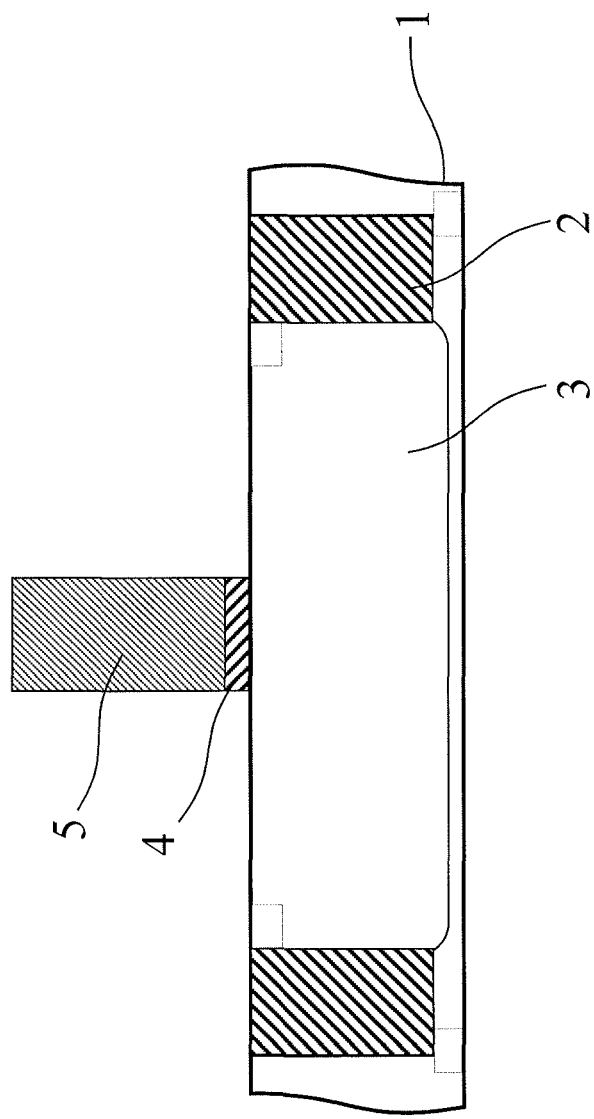
FIG. 1A is a schematic sectional view illustrating a stage of a method of fabricating a semiconductor device according to a first embodiment of the invention.

Some embodiments of the invention will be described below by referring to the drawings.

First Embodiment

A method of fabricating a semiconductor device according to a first embodiment of the invention will be described by referring to FIGS. 1A to 1F. FIGS. 1A to 1F show schematic sectional diagrams illustrating various stages of the method of fabricating a semiconductor device according to the first embodiment of the invention.

Description will be given below of how to form a diffusion layer of a metal oxide semiconductor (MOS) transistor by the method of fabricating a semiconductor device according to the first embodiment of the invention.

As FIG. 1A shows, device isolation regions 2 are formed in a main surface of a silicon substrate 1 by a known method, and then a well diffusion layer region 3 is formed in the main surface of the silicon substrate 1 by a known ion-implantation technique. Then, a gate insulation film 4 is formed on the well diffusion layer region 3 by a known method, and then a gate electrode 5 made of polysilicon or the like is formed on the gate insulation film 4 by a known method.

Figure 1B:
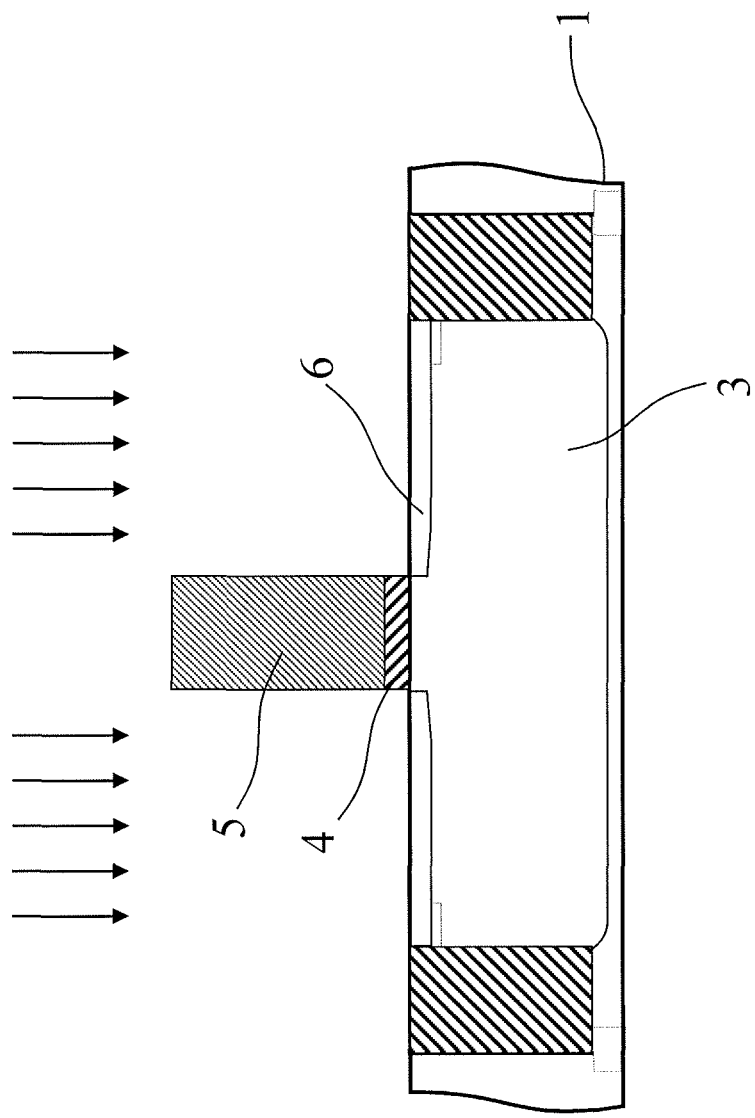
FIG. 1B is a schematic sectional view illustrating a stage of a method of fabricating a semiconductor device according to the first embodiment of the invention.

Then, as FIG. 1B shows, ions are implanted into the main surface of the silicon substrate 1 by a known ion-implantation technique using the gate electrode 5 as a mask. Thus formed are relatively shallow ion-doped regions 6 which are to be a source/drain extension region of the transistor. In this event, crystal defects are formed in the shallow ion-doped regions 6 by the ion-implantation.

As FIG. 1C shows, a silicon oxide film or the like is deposited over the entire main surface of the silicon substrate 1, and then the silicon oxide film is etched back by the reactive ion etching (RIE) method or the like to form gate sidewall insulation films 7. Then, using the gate electrode 5 and the gate sidewall insulation films 7 as a mask, relatively deep ion-doped regions 8, which are to be source/drain contact regions of the transistor, are formed by a known ion-implantation technique. In this event, crystal defects are formed in the deep ion-doped regions 8 by the ion-implantation.

Figure 1D:
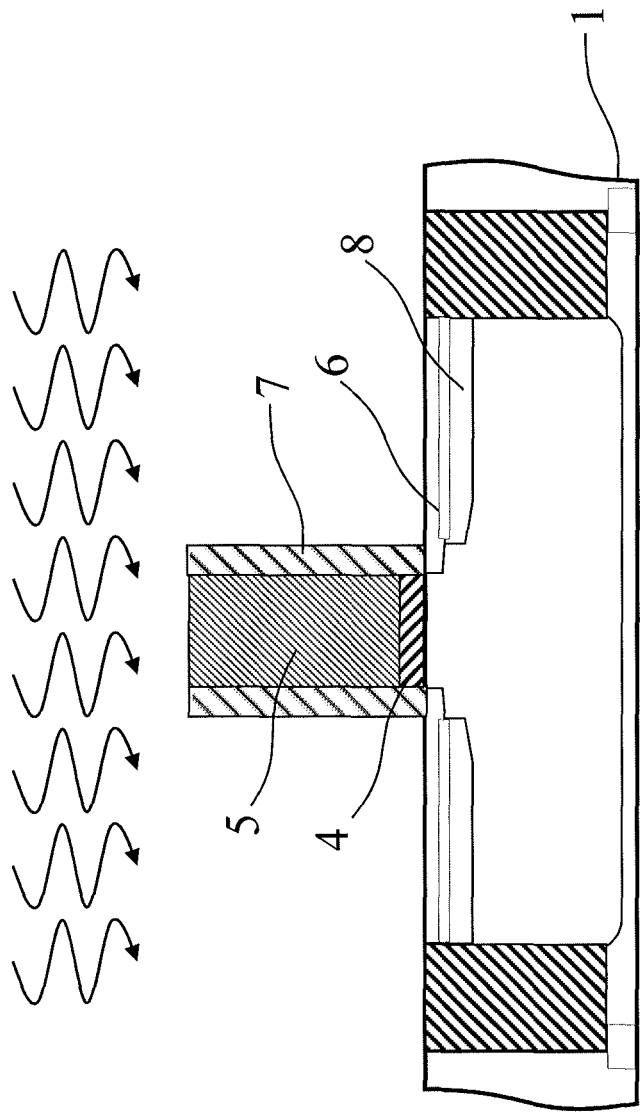
FIG. 1D is a schematic sectional view illustrating a stage of the method of fabricating a semiconductor device according to the first embodiment of the invention.

Then, as FIG. 1D shows, the silicon substrate 1 is annealed by irradiating the entire surface of the silicon substrate 1 with microwaves (hereafter, this annealing will be referred to as the Micro Wave Annealing). The frequency of the microwaves used in the irradiation ranges from 3 GHz to 3 THz. Specifically, the frequency is approximately 5.8 GHz, for example. By irradiating the silicon substrate 1 with the microwaves, the silicon substrate 1 is annealed to a temperature that is not higher than 600° C., or specifically about 500° C., for example. The annealing of several minutes performed in this Micro Wave Annealing almost equalizes the temperature of the top surface of the silicon substrate 1 and that of the backside surface of the silicon substrate 1. Note that the temperature of the top surface and that of the backside surface of the silicon substrate 1 can be measured using a non-contact type radiation thermometer. By irradiating the silicon substrate 1 with microwaves in this way, the crystal defects formed in the shallow ion-doped regions 6 and the deep ion-doped regions 8 can be fixed up.

Now description will be given of the advantage of using Micro Wave Annealing as a method of fixing up crystal defects. As has been described above, the Micro Wave Annealing is employed to fix up the crystal defects formed in the ion-doped regions (i.e., in the shallow ion-doped regions 6 and in the deep ion-doped regions 8) of the silicon substrate 1. The crystal defects are formed mainly by the ion implantation performed at the time of forming the ion-doped regions. The Spike RTA or the like has been conventionally used as the method of fixing up the crystal defects formed in the ion-doped regions. In the Spike RTA, the crystal defects formed in the ion-doped regions are fixed up by annealing the silicon substrate for a relatively short period of time (e.g., a full width at half maximum is 1 to 2 seconds). In the Spike RTA, to fix up the crystal defects, the temperature of the silicon substrate must be raised up to approximately 1000° C. or higher. For this reason, while achieving fixing up the crystal defects in the ion-doped regions, the Spike RTA causes a problem of diffusing the impurity ions in the ion-doped regions. In contrast, in the annealing by microwaves (Micro Wave Annealing) employed in this embodiment, the irradiation of the silicon substrate with microwaves excites the vibrations or rotations of silicon atoms in the silicon substrate, and thus the surface temperature of the silicon substrate can be kept as low as from 200° C. to 600° C. approximately during the annealing. Accordingly, the crystal defects can be fixed up while the rapid diffusion of the impurities that would otherwise take place by the temperature gradient can be restrained. In this way, the use of Micro Wave Annealing makes it possible to fix up the crystal defects formed in the ion-doped regions as well as to restrain the diffusion of the impurity ions in the ion-doped regions.

Figure 1E:
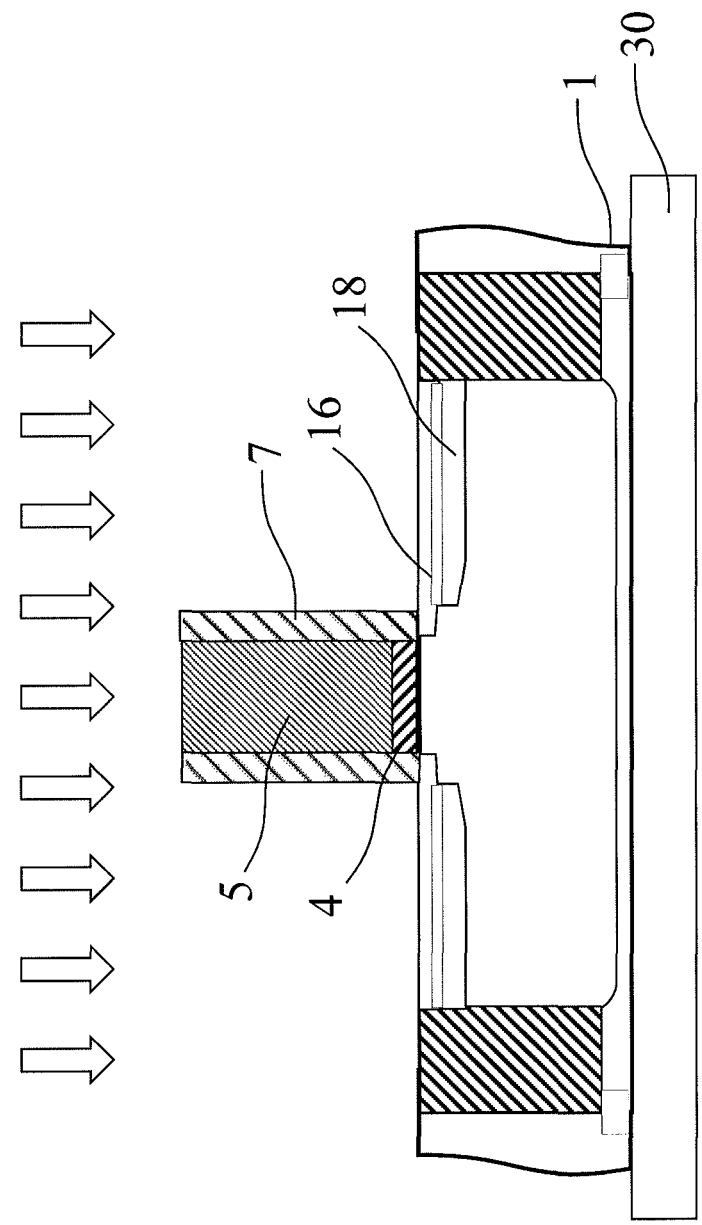
FIG. 1E is a schematic sectional view illustrating a stage of the method of fabricating a semiconductor device according to the first embodiment of the invention.

Then, as FIG. 1E shows, the silicon substrate 1 is transferred to a heat-treatment apparatus, where the silicon substrate 1 is annealed by a flash lamp annealing. By treating the silicon substrate 1 with heat in the flash lamp annealing, the impurity ions introduced into the shallow ion-doped regions 6 and the deep ion-doped regions 8 are activated so as to convert the shallow ion-doped regions 6 and the deep ion-doped regions 8 to source/drain extension diffusion layer regions 16 and source/drain contact diffusion layer regions 18, respectively.

In the flash lamp annealing, the silicon substrate 1 is annealed by light with a pulse width ranging from 0.1 milliseconds to 100 milliseconds, both inclusive, so that the surface temperature of the silicon substrate 1 is raised up to approximately 1100° C. or higher. As has been described above, since being annealing with the high-temperature for an ultra-short period of time, the flash lamp annealing can achieve both the restraining of the diffusion of impurity ions and the higher activation rate of the impurity ions. Note that the energy density of the light emitted from the light source that is used in the flash lamp annealing is, for example, 25 J/cm$^2$ approximately. The light source used in the flash lamp annealing is, for example, a xenon flash lamp.

Note that the flash lamp annealing may be preceded by a preliminarily heating process. Specifically, a preliminarily heating apparatus 30 provided in a heat-treatment apparatus is used to heat (preliminarily heat) the silicon substrate 1 up to a temperature ranging from 300° C. to 600° C. approximately, and the silicon substrate that is kept at the preliminarily heated temperature is then subjected to the subsequent flash lamp annealing. Employing this preliminarily heating process is made to prevent a case where the flash lamp annealing raises the temperature of the silicon substrate 1 rapidly, and the thermal stress thus generated breaks the silicon substrate 1. The preliminarily heating process can prevent such breaking of the silicon substrate 1. An example of the preliminarily heating apparatus is a hot plate formed of a metal plate including a built-in resistance heater. The temperature of the hot plate is controlled by means of a built-in thermocouple thermometer.

This embodiment having been described thus far is based on a case where a flash lamp annealing is employed as the heat treatment process, but a laser annealing may be employed in place of the flash lamp annealing. If a laser annealing is employed, the light to be used has a pulse width ranging from 0.1 milliseconds to 100 milliseconds, both inclusive. Nevertheless, in the case of the laser annealing, it is preferable to use laser with a wavelength ranging from 500 nm to 11 μm (e.g., a $CO_2$ laser).

Figure 1F:
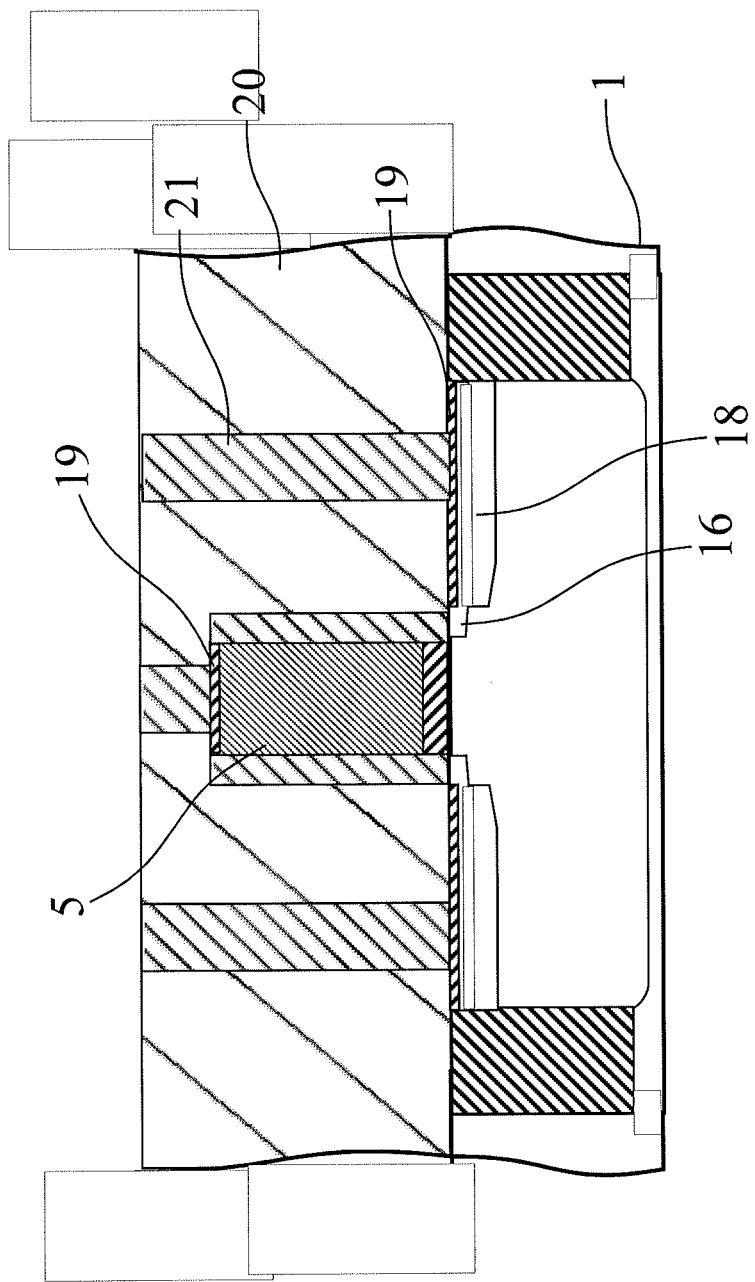
FIG. 1F is a schematic sectional view illustrating a stage of the method of fabricating a semiconductor device according to the first embodiment of the invention.

Then as FIG. 1F shows, a metal, such as nickel (Ni), is deposited on the surface of the silicon substrate 1 by the sputtering method or the like, and then the resultant silicon substrate 1 is subjected to a heat treatment. Thereby the top surface of the gate electrode 5 and the top surfaces of the source/drain contact diffusion layer regions 18 are silicided, and thus nickel silicide films 19 are formed. After the heat treatment, the unreacted metal that remains on the device isolation regions 2 and the like is removed by a wet-etching process or the like. Then, an interlayer insulation film 20, such as a silicon oxide film, is deposited on the surface of the silicon substrate 1, and after that, contact holes are formed both over the gate electrode 5 and over the source/drain contact diffusion layer regions 18. Then, the contact holes are filled with a conductive material, such as a metal, and thus contact plugs 21 are formed. Then, metal wires 22 are connected to the contact plugs 21, and thus the fabrication of the semiconductor device is finished. Through the processes described thus far, a MOS transistor is formed.

Figure 2:
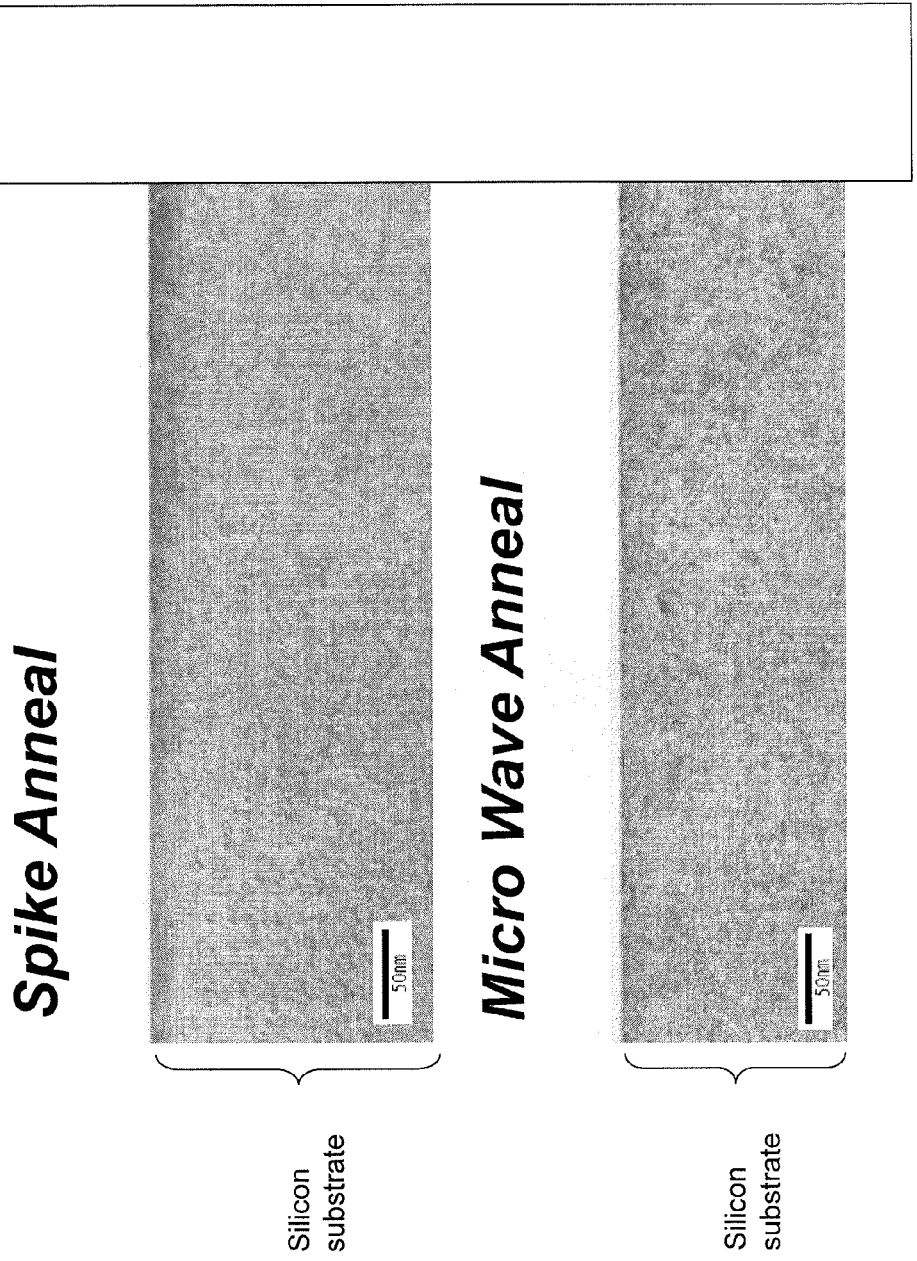
FIG. 2 shows a TEM image of a section of a silicon substrate subjected to Micro Wave Annealing after boron implantation into the silicon substrate, and a TEM image of a section of a silicon substrate subjected to Spike RTA after boron implantation into the silicon substrate.
Figure 3:
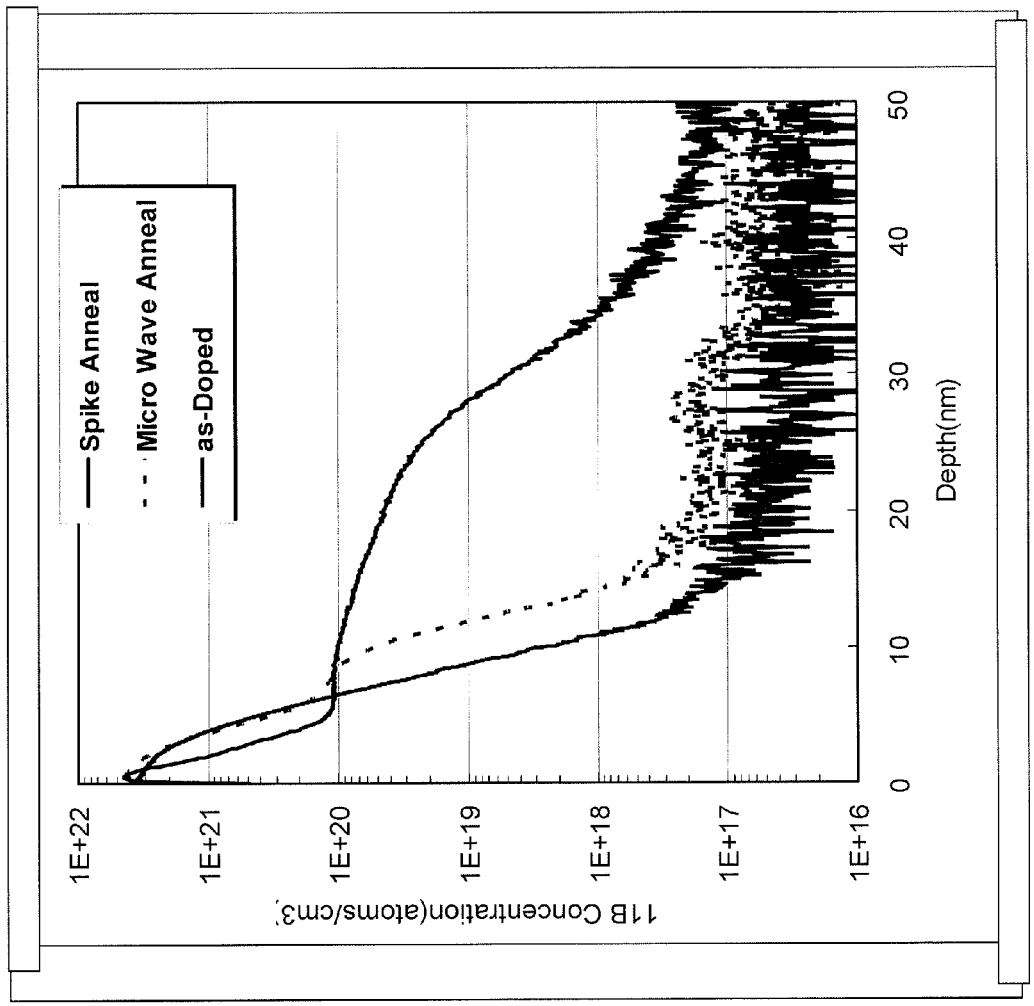
FIG. 3 shows a graph illustrating the impurity concentrations measured by SIMS at various depth of the silicon substrate.

Then, some advantages that the microwave annealing has over the conventional spike RTA will be described by referring to FIGS. 2 and 3. FIG. 2 shows transmission electron microscope (TEM) images of sections of silicon substrates. One of the images is of a case where a silicon substrate doped with boron is subjected to microwave annealing (annealing time: 10 minutes; temperature of the silicon substrate: 525° C.), and the other one is of a case where a silicon substrate doped with boron is subjected to spike RTA (temperature of the silicon substrate: 1050° C.). As FIG. 2 shows, no recognizable defects is found both in the case of the microwave annealing preceded by the implantation of boron and in the case of the spike RTA preceded by the implantation of boron. In this way, though the annealing temperature (i.e., the temperature of the silicon substrate at the time of annealing) during the microwave annealing is lower than the annealing temperature during the spike RTA, the microwave annealing can fix up the crystal defects formed in the silicon substrate after the implantation of boron. FIG. 3 shows a graph illustrating the impurity concentrations measured by secondary ion-microprobe mass spectrometer (SIMS) at various depth of the silicon substrate shown in FIG. 2. As FIG. 3 shows, in comparison to the impurity profile after the spike RTA (indicated as "Spike Anneal" in FIG. 3), the impurity profile after the microwave annealing (indicated as "Micro Wave Anneal" in FIG. 3) shows that the diffusion of the impurities from the impurity profile immediately after the ion implantation (indicated as "as-Doped" in FIG. 3) is restrained. In this way, the microwave annealing with its lower annealing temperature than the annealing temperature during the spike RTA can restrain the diffusion of the impurities, and at the same time the microwave annealing can fix up the crystal defects as in the case of the spike RTA.

As has been described thus far, in this embodiment, ion-doped regions are formed in the silicon substrate 1 by the ion-implantation, the silicon substrate 1 is irradiated with microwaves, and then the flash lamp annealing is performed. Accordingly, while restraining the diffusion of the impurity ions in the ion-doped regions, the microwave annealing can fix up the crystal defects in the ion-doped regions. In addition, while restraining the diffusion of the impurity ions in the ion-doped regions, the flash lamp annealing can activate the impurity ions in the ion-doped regions.

This embodiment having been described thus far is based on a case where after the microwave annealing process shown in FIG. 1D, the silicon substrate 1 is transferred to a heat-treatment apparatus, where the flash lamp annealing process shown in FIG. 1E is performed. Accordingly, the microwave annealing process that requires relatively long annealing time can be done with a batch-type apparatus whereas the flash lamp annealing process that requires relatively short annealing time can be done with a sheet-type apparatus. Thus, a higher throughput can be secured. Note that use of a heat-treatment apparatus that is capable of performing both the microwave annealing and the flash lamp annealing allows the flash lamp annealing to be performed immediately after the microwave annealing. In this case, the microwave annealing not only fixes up the crystal defects but also preliminarily heats the silicon substrate before the flash lamp annealing. Consequently, the preliminarily heating apparatus 30 is no longer required.

Note that some of the crystal defects in the ion-doped regions are naturally fixed up during the flash lamp annealing as well. In addition, some of the impurity ions in the ion-doped regions are naturally activated by the microwave annealing as well.

Second Embodiment

Next, a method of fabricating a semiconductor device according to a second embodiment of the invention will be described by referring to FIGS. 4A to 4D. FIGS. 4A to 4D show schematic sectional diagrams illustrating various stages of the method of fabricating a semiconductor device according to the second embodiment of the invention. The method of fabricating a semiconductor device according to the second embodiment of the invention differs from the method of fabricating a semiconductor device according to the first embodiment in the sequence in which the process of microwave irradiation and the process of flash lamp annealing are performed. In the following description, those constituent portions that are identical to their respective counterparts in the first embodiment are denoted by the same reference numerals that are used in the first embodiment. In addition, those constituent portions and processes that are identical to their respective counterparts in the first embodiment will not be described again in the following description.

Figure 4A:
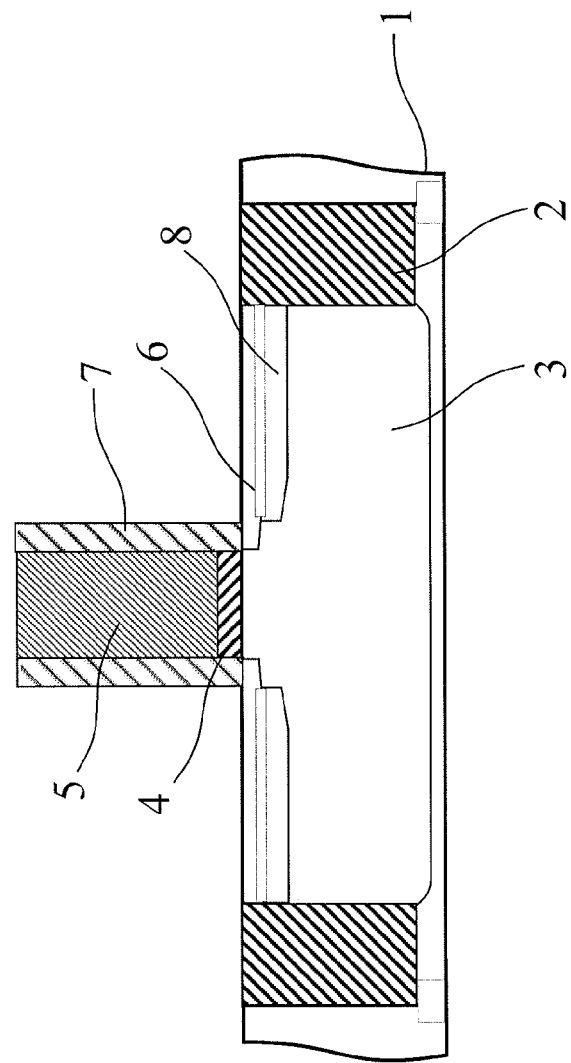
FIG. 4A a schematic sectional view illustrating a stage of a method of fabricating a semiconductor device according to a second embodiment of the invention.

As FIG. 4A shows, both shallow ion-doped regions 6 and deep ion-doped regions 8 are formed in a silicon substrate 1 by processes that are similar to those shown in FIGS. 1A to 1C of the first embodiment. As described in the first embodiment, crystal defects are formed both in the shallow ion-doped regions 6 and in the deep ion-doped regions 8.

Figure 4B:
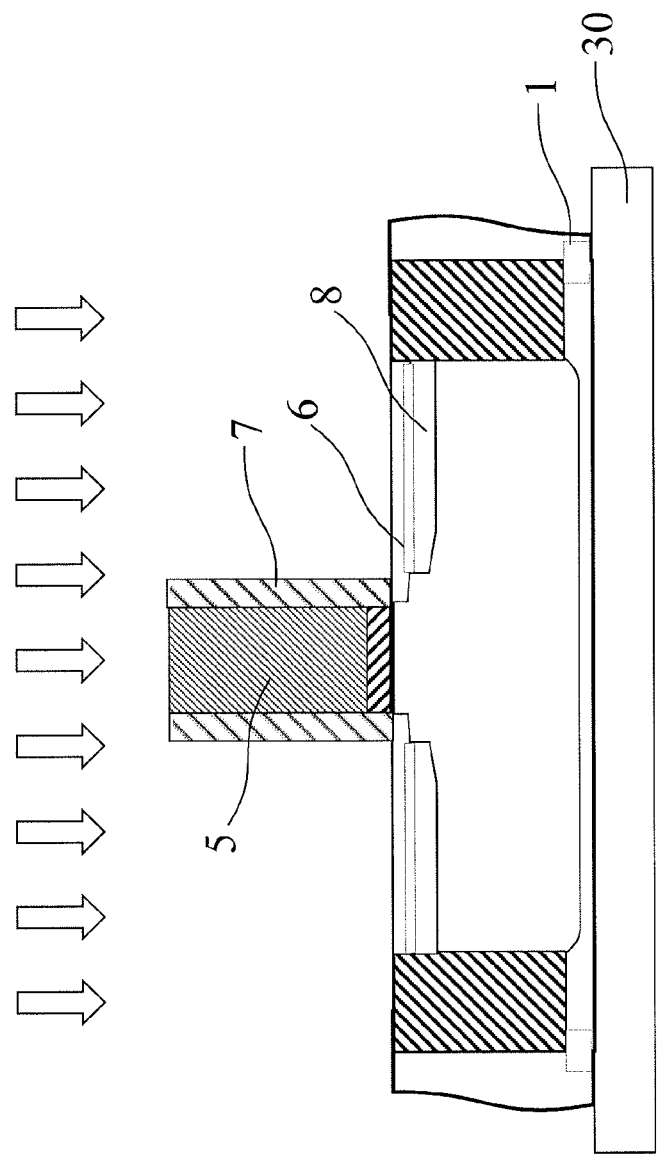
FIG. 4B is a schematic sectional view illustrating a stage of the method of fabricating a semiconductor device according to the second embodiment of the invention.

Then, as FIG. 4B shows, the silicon substrate 1 is annealed by a flash lamp annealing. The heat treatment of the silicon substrate 1 in the flash lamp annealing activates the impurity ions that have been introduced both into the shallow ion-doped regions 6 and into the deep ion-doped regions 8. Thus, the shallow ion-doped regions 6 and the deep ion-doped regions 8 are converted to source/drain extension diffusion layer regions 16 and source/drain contact diffusion layer regions 18, respectively. As described in the first embodiment, before the flash lamp annealing is performed, the silicon substrate 1 may be preliminarily heated using a preliminarily heating apparatus 30. The effects and the like of the flash lamp annealing are similar to those obtained in the first embodiment, and thus will not be described here.

Figure 4C:
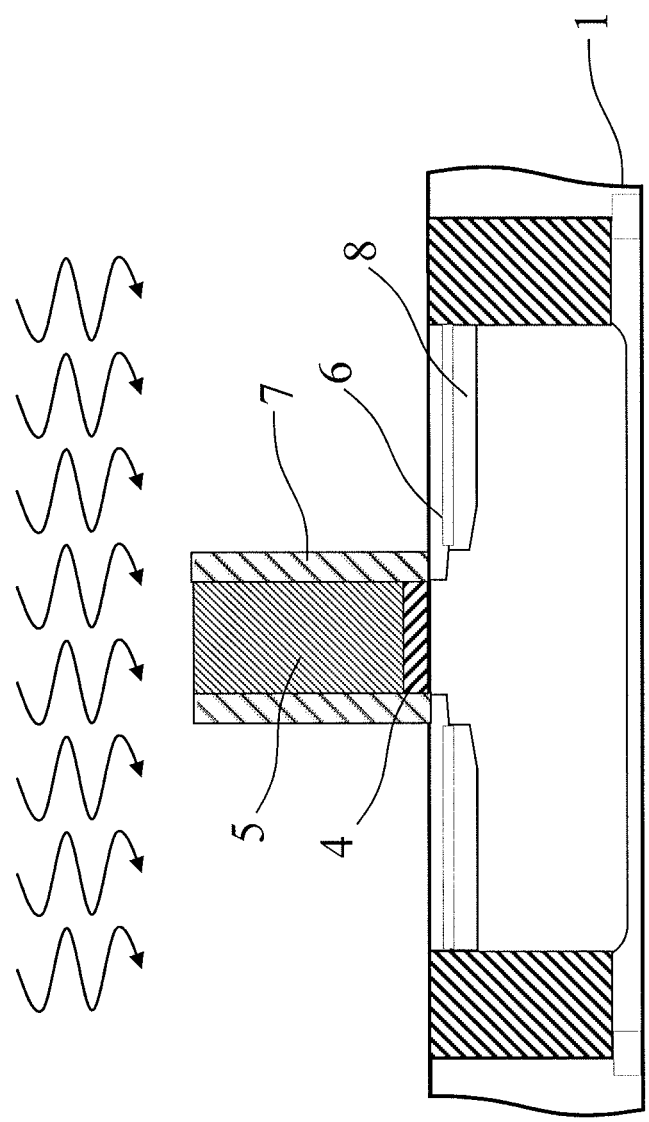
FIG. 4C is a schematic sectional view illustrating a stage of the method of fabricating a semiconductor device according to the second embodiment of the invention.

Then, as FIG. 4C shows, silicon substrate 1 is annealed by irradiating the entire surface of the silicon substrate 1 with microwaves (microwave annealing). By irradiating the silicon substrate 1 with microwaves, the silicon substrate 1 can be annealed at a temperature that is as low as 600° C. or lower, e.g., at 500° C. approximately. The microwave annealing can fix up the crystal defects formed both in the shallow ion-doped regions 6 and in the deep ion-doped regions 8.

Figure 4D:
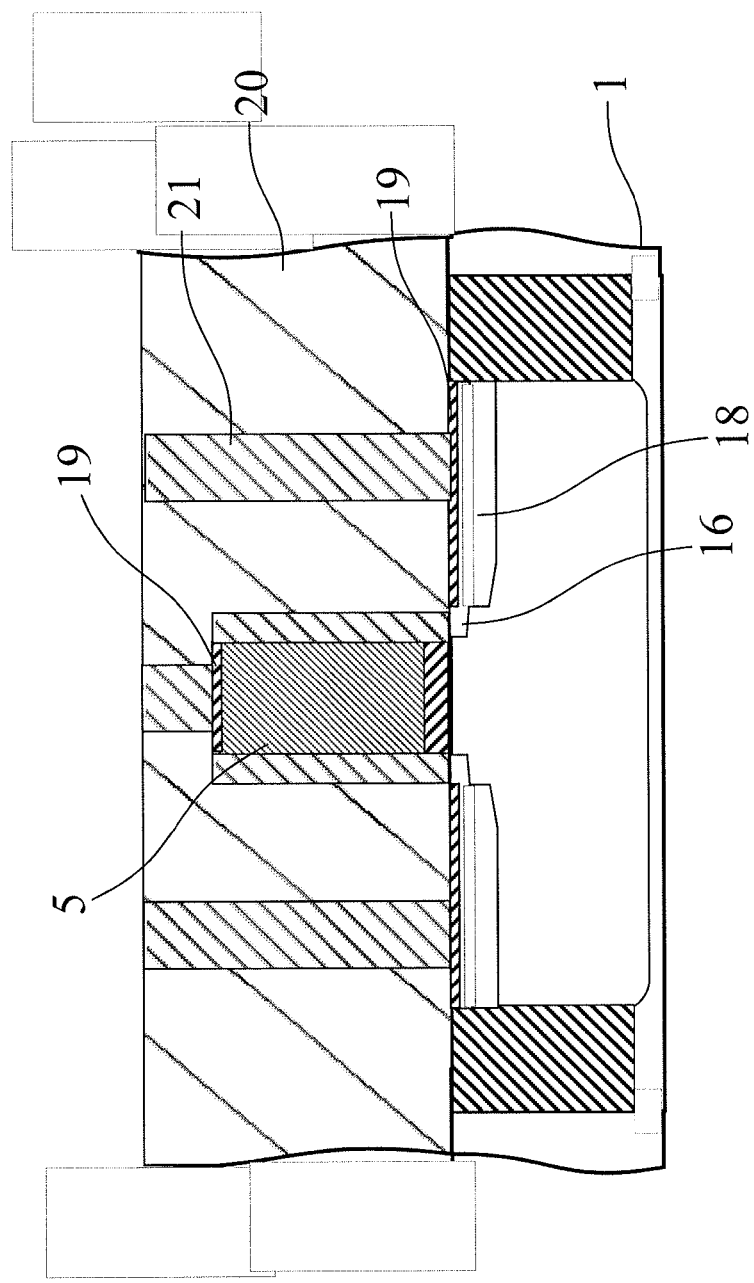
FIG. 4D is a schematic sectional view illustrating a stage of the method of fabricating a semiconductor device according to the second embodiment of the invention.

Then, as FIG. 4D shows, nickel silicide films 19, an interlayer insulation film 20, contact plugs 21, and metal wires 22 are formed in a manner that is similar to the one shown in FIG. 1F of the first embodiment. By the processes described thus far, a MOS transistor is formed.

As has been described thus far, in this second embodiment, ion-doped regions are formed in the silicon substrate 1 by the ion-implantation, then the flash lamp annealing is performed, and then the silicon substrate 1 is irradiated with microwaves. Accordingly, the flash lamp annealing can activate the impurity ions in the ion-doped regions while restraining the diffusion of the impurity ions in the ion-doped regions. In addition, the microwave annealing can fix up the crystal defects in the ion-doped regions while restraining the diffusion of the impurity ions in the ion-doped regions.

Note that the description given thus far is based on a case of forming both source/drain extension diffusion layer regions and source/drain contact diffusion layer regions of a MOS transistor. However, the application of the method of fabricating a semiconductor device of the invention is not limited to such a case. The method of fabricating a semiconductor device of the invention is applicable to other cases of forming various ultra-shallow diffusion layers.

In addition, the description given thus far is based on a case where diffusion layers are formed in a silicon substrate. However, the silicon substrate is not the only place where the diffusion layers can be formed. The method of the invention is also applicable to cases where diffusion layers are formed in various kinds of semiconductor substrate, such as an epitaxial wafer and an SOI wafer, and also to cases where diffusion layers are formed in various kinds of semiconductor layers.

Note that the above-described embodiments are provided not for the purpose of limiting the invention but for the sake of easy understanding of the invention. Various modification or improvements can be made on the invention without departing from the essence of the invention. In addition, the invention includes various equivalents of the invention.

What is claimed is:

1. A method of fabricating a semiconductor device comprising:
   an ion implantation step of implanting ions into a semiconductor substrate to form source and drain extension regions and source and drain contact regions;
   a microwave irradiation step of irradiating the semiconductor substrate with microwaves after the ion implantation step to induce vibrations or rotations of atoms in the semiconductor substrate for fixing up crystal defects in the source and drain extension regions and the source and drain contact regions caused by the ion implantation step; and
   a heat treatment step of treating the semiconductor substrate with heat by irradiating the semiconductor substrate with light having a pulse width ranging from 0.1 milliseconds to 100 milliseconds, both inclusive, after the microwave irradiation step.

2. The method of fabricating a semiconductor device according to claim 1, wherein, in the microwave irradiation step, the semiconductor substrate is treated with heat by being irradiated with microwaves with a substrate temperature of the semiconductor substrate kept at 600° C. or below.

3. The method of fabricating a semiconductor device according to claim 2, further comprising a preliminarily heat step of preliminarily heating the semiconductor substrate before the heat treatment step,
   wherein the heat treatment step is performed on the semiconductor substrate kept at a temperature to which the semiconductor substrate is preliminarily heated in the preliminarily heat step.

4. The method of fabricating a semiconductor device according to claim 3, wherein a light source of the light with which the semiconductor substrate is irradiated in the heat treatment step is anyone of a xenon flash lamp and a laser with a wavelength ranging from 500 nm to 11 μm.

5. The method of fabricating a semiconductor device according to claim 4, wherein in the microwave irradiation step, a plurality of the semiconductor substrates are irradiated by a batch-type apparatus.

6. The method of fabricating a semiconductor device according to claim 2, wherein the heat given to the semiconductor substrate in the microwave irradiation step is used as preheat for performing the heat treatment step.

7. A method according to claim 1, wherein
   the semiconductor substrate is silicon wafer, and
   the frequency of the microwaves used in the irradiation includes 5.8 GHz.

8. A method of fabricating a semiconductor device comprising:
   an ion implantation step of implanting ions into a semiconductor substrate to form source and drain extension regions and source and drain contact regions, the semiconductor substrate being a silicon wafer;
   a microwave irradiation step of irradiating the semiconductor substrate with microwaves after the ion implantation step to fix up crystal defects in the source and drain extension regions and the source and drain contact regions, the frequency of the microwaves used in the irradiation including 5.8 GHz; and
   a heat treatment step of treating the semiconductor substrate with heat by irradiating the semiconductor substrate with light having a pulse width ranging from 0.1 milliseconds to 100 milliseconds, both inclusive, after the microwave irradiation step.

9. The method of fabricating a semiconductor device according to claim 8, wherein, in the microwave irradiation step, the semiconductor substrate is treated with heat by being irradiated with microwaves with a substrate temperature of the semiconductor substrate kept at 600° C. or below.

10. The method of fabricating a semiconductor device according to claim 9, wherein the heat given to the semiconductor substrate in the microwave irradiation step is used as preheat for performing the heat treatment step.

11. The method of fabricating a semiconductor device according to claim 8, wherein, in the microwave irradiation step, a plurality of the semiconductor substrates are irradiated by a batch-type apparatus.

* * * * *